(12) United States Patent
Blankenship et al.

(10) Patent No.: US 7,053,658 B1
(45) Date of Patent: May 30, 2006

(54) APPARATUS FOR CIRCUIT WITH KEEPER

(75) Inventors: Timothy L. Blankenship, Austin, TX (US); Sijian Chen, Austin, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/724,028

(22) Filed: Nov. 26, 2003
(Under 37 CFR 1.47)

(51) Int. Cl.
*H03K 19/0175* (2006.01)
(52) U.S. Cl. .............................. 326/81; 326/80; 326/68
(58) Field of Classification Search ............ 326/95–98, 326/112, 119, 121, 68, 80–81; 327/333

See application file for complete search history.

(56) References Cited

U.S. PATENT DOCUMENTS

| 5,604,449 A | | 2/1997 | Erhart et al. | |
|---|---|---|---|---|
| 6,060,909 A | * | 5/2000 | Aipperspach et al. | 326/98 |
| 6,320,414 B1 | * | 11/2001 | Annema et al. | 326/80 |
| 6,693,469 B1 | * | 2/2004 | Prodanov | 327/108 |

* cited by examiner

*Primary Examiner*—Anh Q. Tran
(74) *Attorney, Agent, or Firm*—Darby & Darby PC; Matthew M. Gaffney (57) ABSTRACT

A keeper switch circuit is configured to minimize capacitive coupling between the gate and drain of a cascode transistor. The keeper switch circuit is coupled between the source and gate of a cascode transistor. The keeper switch circuit is on if a voltage at the drain of the keeper switch circuit corresponds to a first logic level. The source and gate of the cascode transistor are coupled together if the keeper switch circuit is on.

9 Claims, 7 Drawing Sheets

APPARATUS FOR CIRCUIT WITH KEEPER

FIELD OF THE INVENTION

The invention related to a keeper circuit. In particular, the invention related to a keeper circuit for ensuring that the high-range and low-range outputs of a circuit utilizing voltage doubling techniques are actively driven.

BACKGROUND

Voltage doubling is a technique that makes it possible to design electrical circuits that operate with high power supply voltages (e.g. 10 V or above), while not allowing the Vgs, Vgd, or Vds of the individual transistors in the circuit to exceed a lower value, such as 5 V. The voltage doubling technique is often implemented with cascode transistors. In general, voltage doubling techniques may be used to extend the operating range to approximately 2X volts, where the underlying components can withstand X volts.

BRIEF DESCRIPTION OF THE DRAWINGS

Non-limiting and non-exhaustive embodiments of the present invention are described with reference to the following drawings, in which.

DETAILED DESCRIPTION

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other signal.

Briefly stated, the invention is related to a circuit with a keeper switch that is configured to minimize capacitive coupling between the gate and drain of a transistor arranged in a cascode configuration. The keeper switch is coupled between the source and gate of the cascode transistor. The keeper switch is active if a voltage at the drain of the keeper switch circuit corresponds to a first logic level. If this event occurs, the source and gate of the cascode transistor are coupled together.

Figure 1:
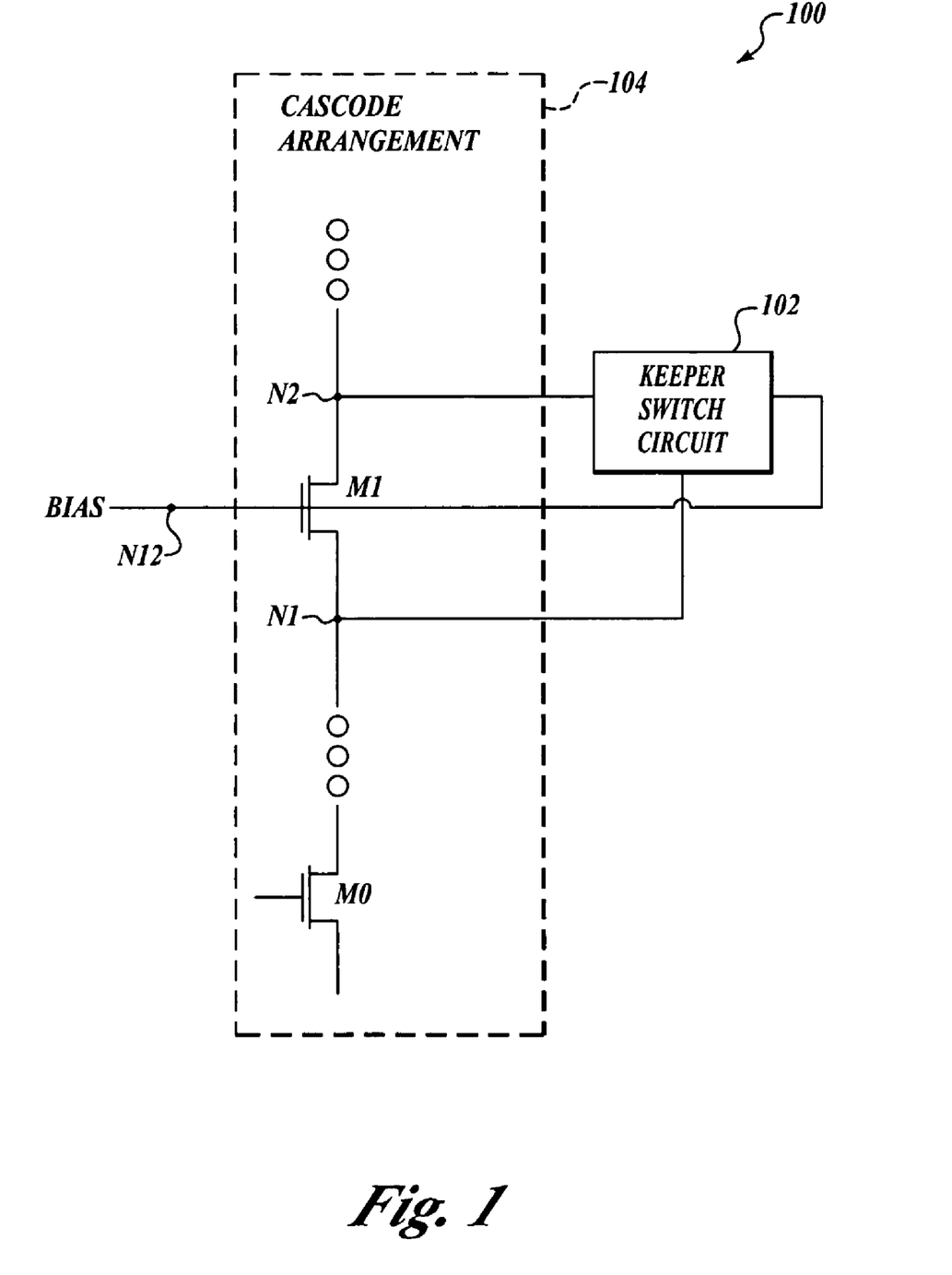
FIG. 1 illustrates a schematic diagram of a circuit that includes a keeper switch.

FIG. 1 illustrates a block diagram of a circuit (100) that includes a keeper switch circuit. Circuit 100 includes a first transistor (M0) and a second transistor (M1) configured in a cascode arrangement (104), and a keeper switch circuit (102). The second transistor (M1) has a gate that is coupled to a bias node (N12), a drain that is coupled to a first output node (N1), and a source that is coupled to a second output node (N2). The keeper switch circuit (102) has three terminals that are respectively coupled to the gate of second transistor (M1), the drain of second transistor (M1), and the source of the second transistor (M1). The second transistor (M1) is configured to receive a first cascode bias voltage (bias) at the bias node (N12). The first cascode bias voltage (signal bias) is suitable as a cascode bias voltage.

The keeper switch circuit (102) is configured to influence a resistance between the second output node (N2) and the bias node (N12) in response to a control signal (e.g. signal bias). The keeper switch circuit (102) is configured to couple the second output node (N2) to the bias node (N12) if the control signal corresponds to a first logic level. The keeper switch circuit (102) is further configured to isolate the second output node (N2) from the bias node (N12) if the control signal corresponds to a second logic level.

Figure 2:
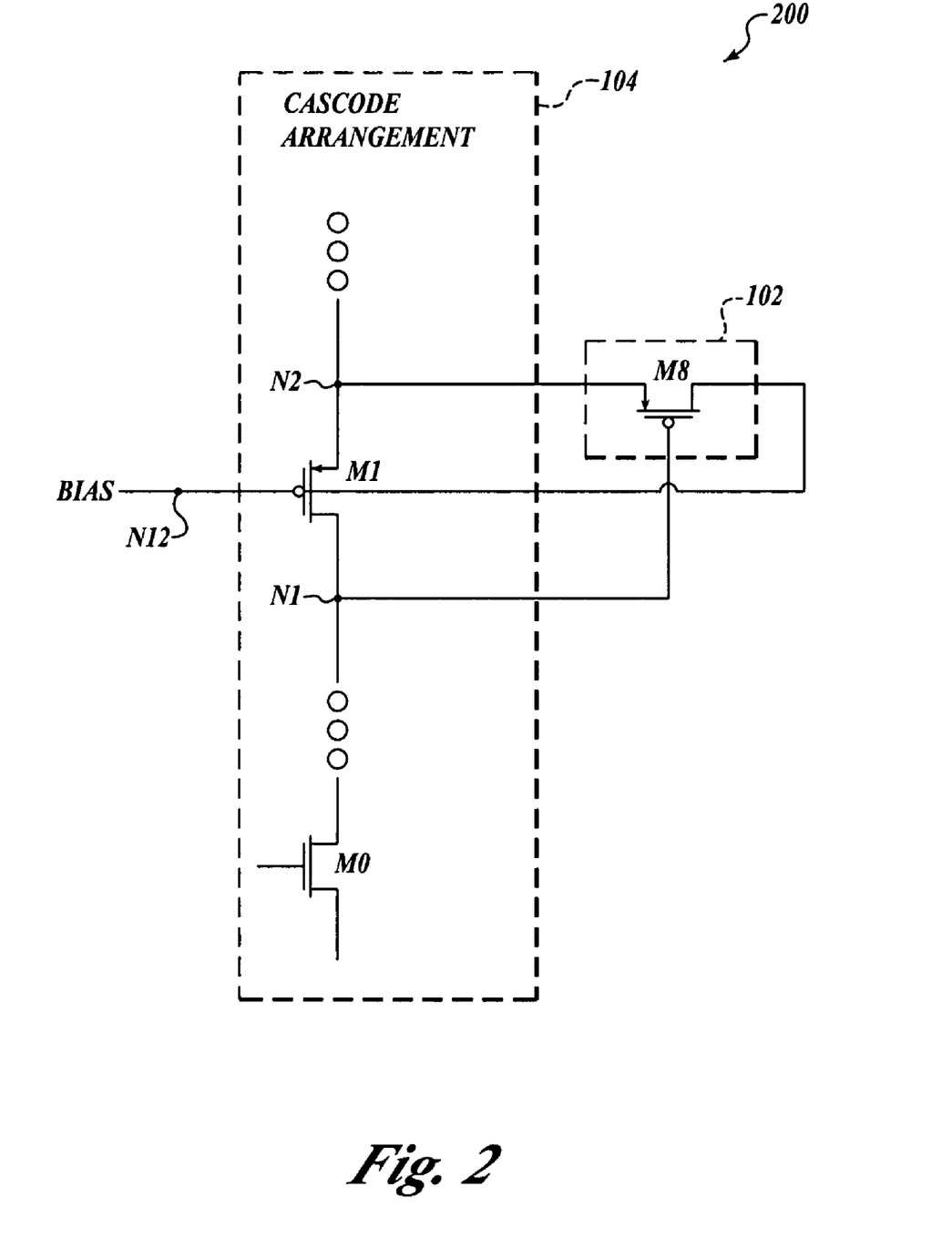
FIG. 2 shows a schematic diagram of an exemplary embodiment of the circuit of FIG. 1.

In FIG. 2, circuit 200 is a particular implementation of circuit 100, where the keeper switch circuit (102) is implemented by a transistor (M8). Transistor M8 has a gate that is coupled to the first output node (N1), a source that is coupled to the second output node (N2), and a drain that is coupled to the bias node (N12). Alternatively, the drain may be coupled to the second output node (N2), and the source may be coupled to the bias node (N12).

Figure 3:
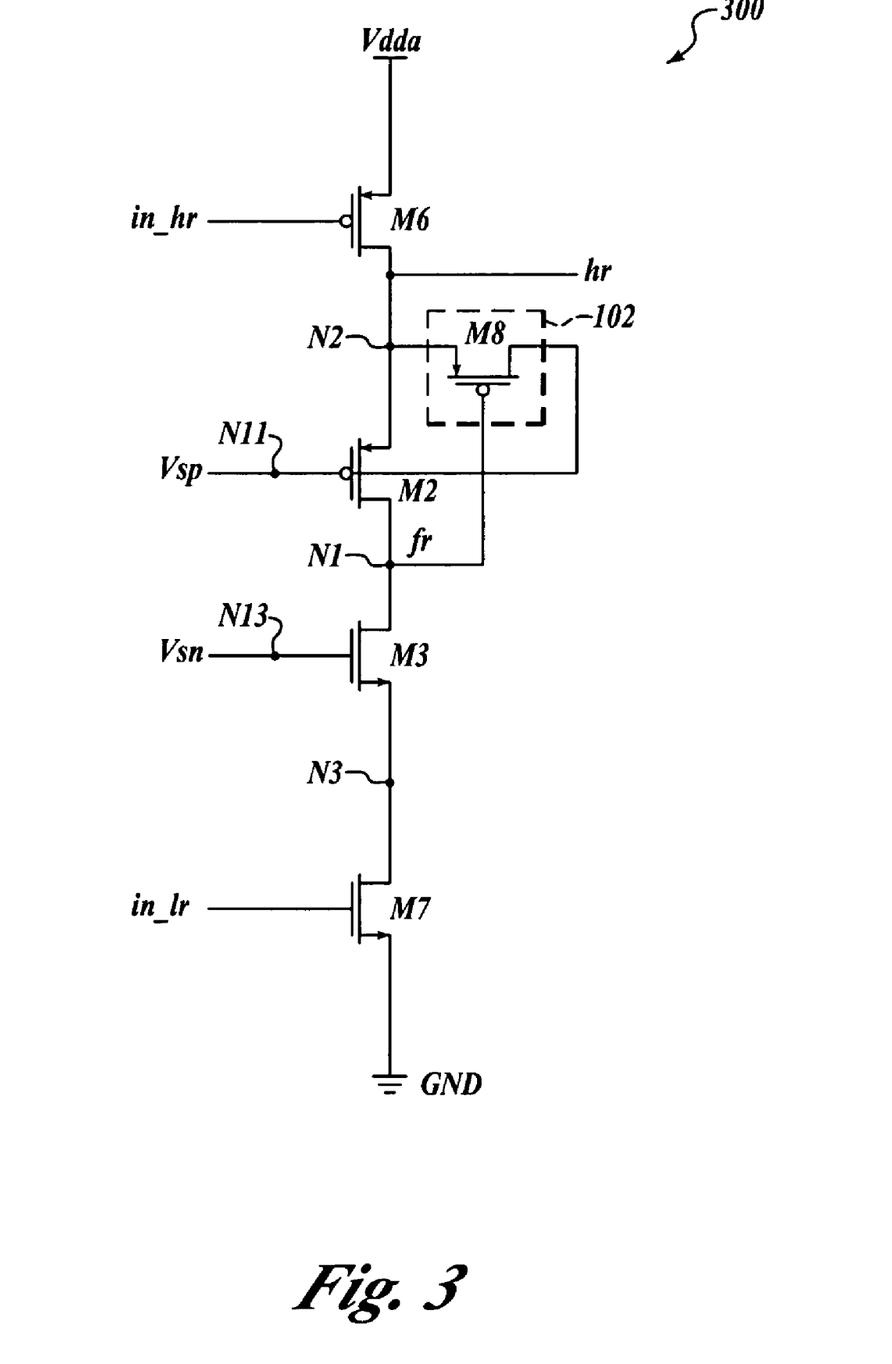
FIG. 3 illustrates a schematic diagram of an exemplary embodiment of an inverter circuit with a keeper switch.

FIG. 3 illustrates a schematic diagram of a circuit (300) that is an exemplary implementation of circuit 100. Circuit 300 is a high-voltage inverter that utilizes voltage doubling techniques. Circuit 300 includes transistors M2–M3 and M6–M7, and keeper switch circuit 102. Keeper switch circuit 102 is implemented by transistor M8. Transistor M8 has a gate that is coupled to node N1, a source that is coupled to node N2, and a drain that is coupled to node N11.

Transistors M2 and M3 are each arranged to operate as a cascode transistor. Transistor M2 is configured to receive a first bias signal Vsp at a gate of transistor M2 (node N11), and transistor M3 is configured to receive a second bias signal Vsn at a gate of transistor M3 (node N13). Signal Vsp is a cascode bias voltage that is used to bias transistor M2, and signal Vsn is a cascode bias voltage that is used to bias transistor M3. The voltages associated with signals Vsp and Vsn are set by several factors including the power supply voltage, the maximum Vgs, Vgd, and Vds of the process for relatively long-term reliability, the threshold voltages of the transistors, the junction diode breakdowns of the transistors, and the input voltage swing. Signals Vsp and Vsn are selected such that the maximum Vgs, Vgd, and Vds of the transistors for relatively long-term reliability are not exceeded.

Transistor M6 is configured to receive a high-range signal in_hr at the gate of transistor M6, and transistor M7 is configured to receive a low-range signal in_lr at the gate of transistor M7. Signal in_lr is bounded between 0 volts and approximately Vdda/2, where Vdda is the voltage associated with the power supply. Signal in_hr is bounded between Vdda and approximately Vdda/2. Signal in_hr and signal in_lr each correspond to substantially the same logic level at approximately the same time. A high-range output signal (hr) is provided at the drain of transistor M6 (node N2). The logic level associated with signal hr corresponds to the inverse of the logic level of signals in_lr and in_hr. Circuit 300 is also configured to provide a full-range output signal (fr) at the source of transistor M2 (node N1), and a low-range output signal (lr) at the source of transistor M3 (node N3). Signals fr and lr each correspond to the same logic level as signal hr, but are bounded over different ranges. Signal lr is bounded between 0 volts and approximately Vdda/2, signal hr is bounded between approximately Vdda/2 and Vdda, and signal fr is bounded between 0 volts and Vdda.

Transistor M8 is configured to ensure that signal hr is actively driven regardless of the voltage associated with signals in_hr and in_lr, even at initial power-on. Transistor M8 is arranged for preventing charge injection (i.e. capacitive coupling) that could otherwise be caused as a result of the gate-to-drain capacitance on transistor M6. If present, injected charge could cause a voltage at the gate of transistor M6 to move outside of the desired operating range for Vgs, Vds, and Vgd of transistors M6. According to the example illustrated in FIG. 3, transistor M2 is a p-type transistor, and transistor M8 is a p-type transistor.

Figure 4:
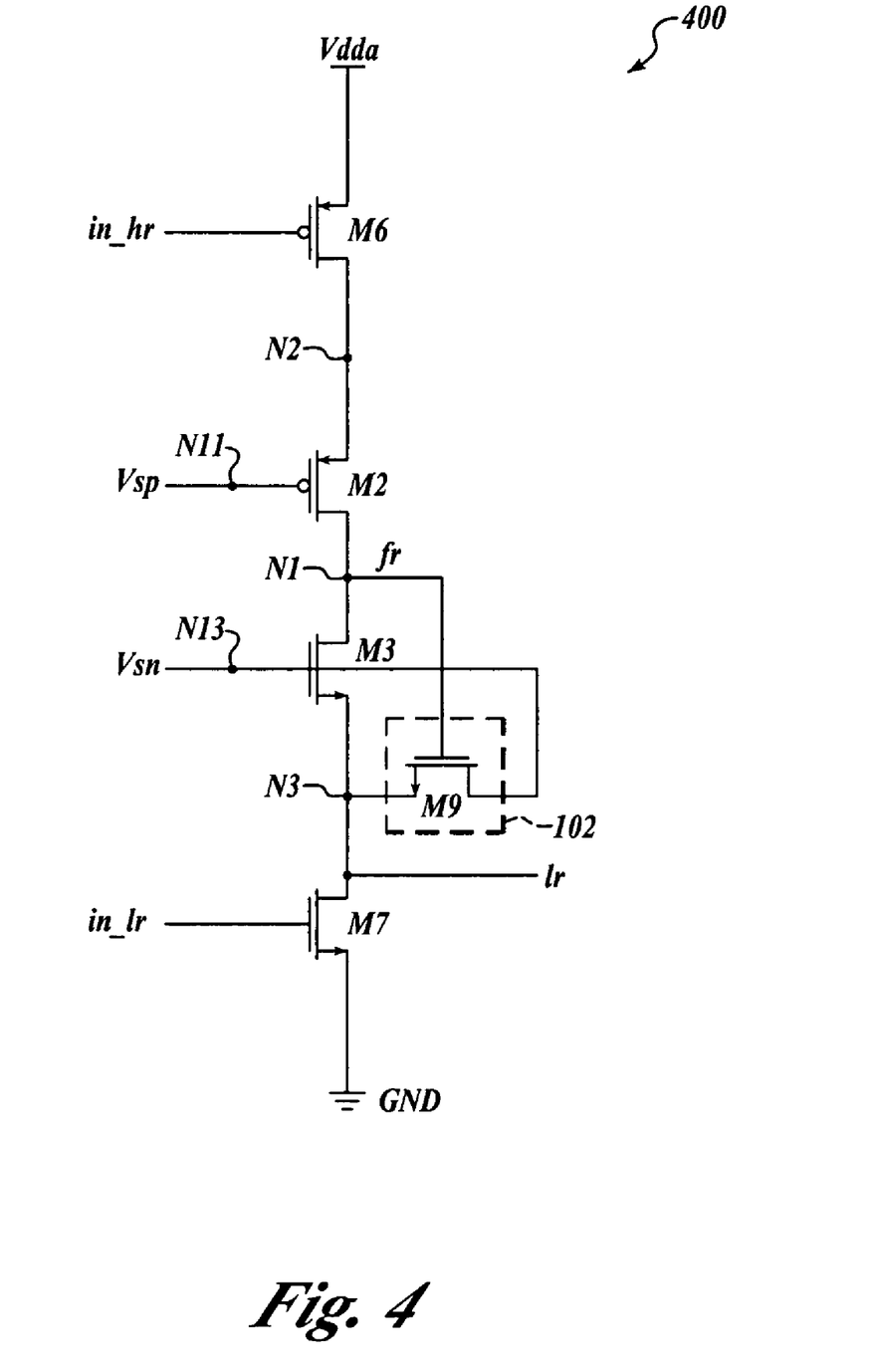
FIG. 4 shows a schematic diagram of another exemplary embodiment of an inverter circuit with a keeper switch.

FIG. 4 illustrates a schematic diagram of a circuit (400) that is another exemplary implementation of FIG. 1. Circuit 400 is substantially similar to circuit 300 in some ways, albeit different in other ways. In circuit 400, keeper switch circuit 102 is implemented by transistor M9. Transistor M9 has a gate that is coupled to node N1, a drain that is coupled to node N13, and a source that is coupled to node N3.

Transistor M9 is configured to ensure that signal lr is actively driven independent of the voltage associated with signals in_hr and in_lr, including at the initial power-on state. Transistors M3 and M9 are n-type transistors.

Figure 5:
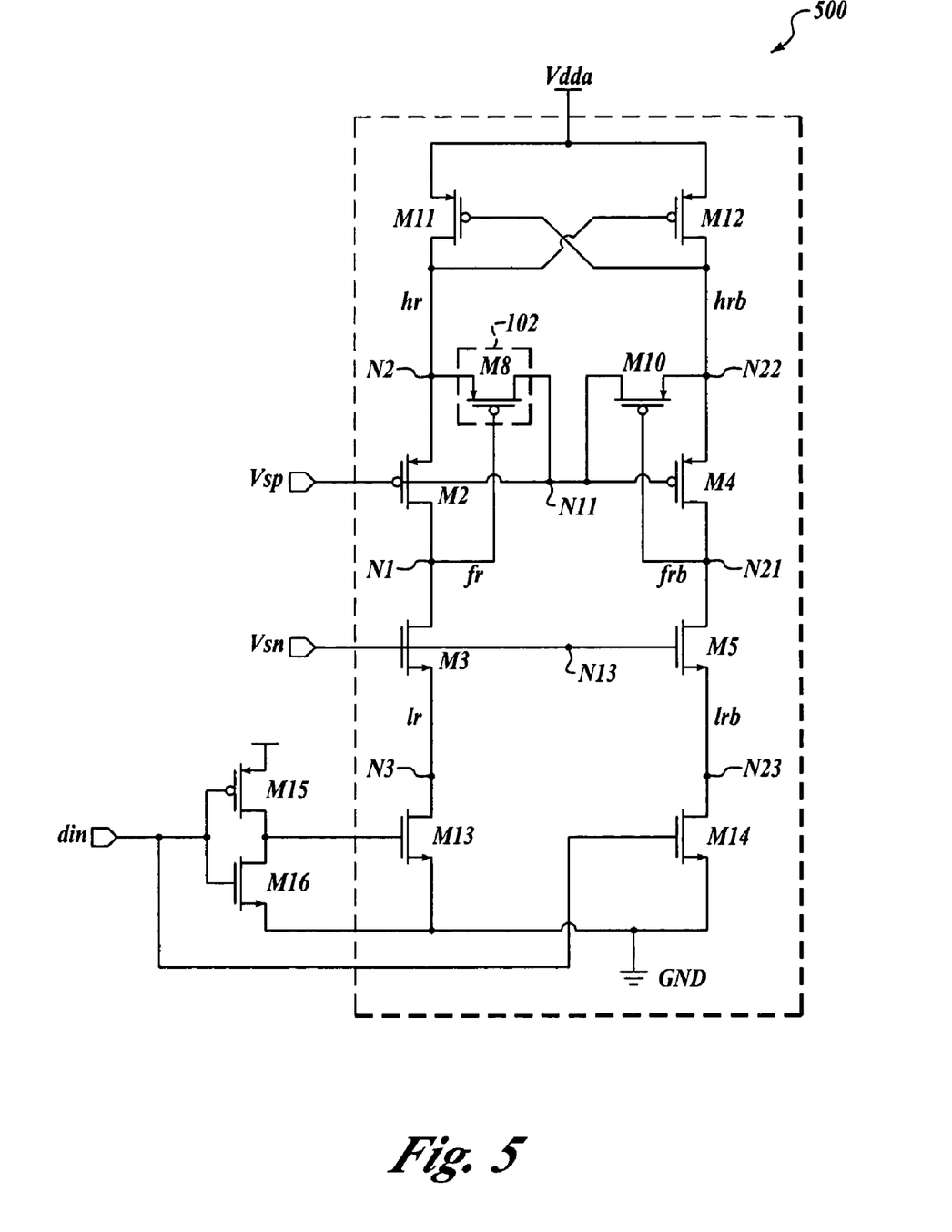
FIG. 5 illustrates a schematic diagram of an exemplary embodiment of a level translator circuit with a keeper switch.

FIG. 5 illustrates a schematic diagram of a level-shifter circuit (500). Circuit 500 includes transistors M2–M5 and M11–M16, keeper circuit 102 (transistor M8) and another keeper circuit (transistor M10). Transistor M4 has a gate that is coupled to node N11, a drain that is coupled to a first complement output node N21, and a source that is coupled to a second complement output node N22. Transistor M10 has a gate that is coupled to node N21, a source that is coupled to node N22, and a drain that is coupled to node N11.

Transistor M8 is configured to operate in a substantially similar manner as described with regard to FIG. 3, albeit different in some ways. Transistor M4 is arranged to operate as a cascode transistor in cooperation with transistor M12. Transistor M5 is configured to operate as a cascode transistor in cooperation with transistor M14. Circuit 500 is configured to provide signals hr, fr, lr, hrb, frb, and lrb in response to a data input signal (din). Signal hrb is a complement of signal hr, signal frb is a complement of signal fr, and signal lrb is a complement of signal lr. As an example, transistors M2, M4, M8, and MIO are each p-type transistors. Transistor M8 is configured to ensure that signal hr is actively driven regardless of the voltage associated with signal din. Transistor MIO is configured to ensure that signal hrb is actively driven regardless of the voltage associated with signal din.

Figure 6:
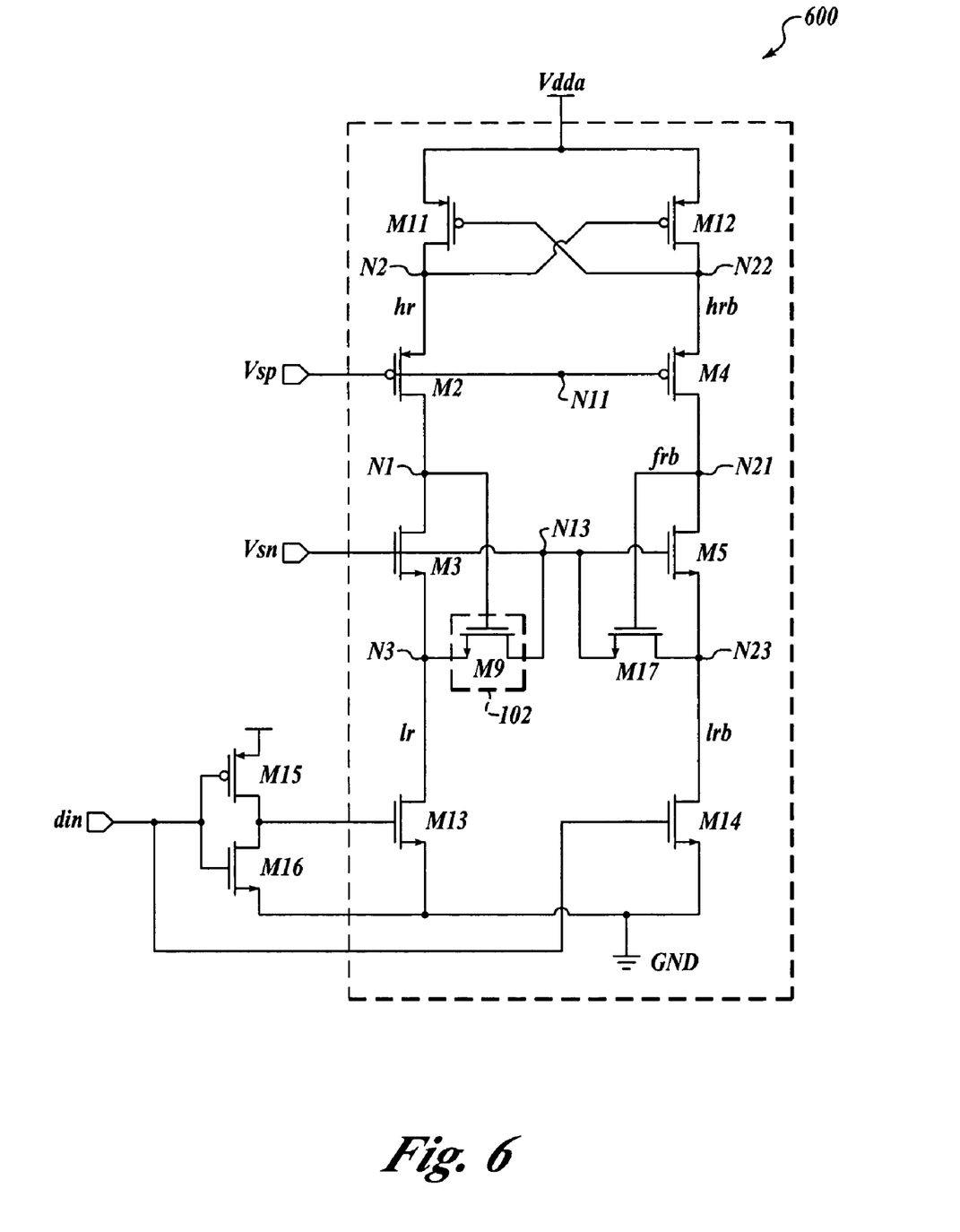
FIG. 6 shows a schematic diagram of another exemplary embodiment of a level translator circuit with a keeper switch.

FIG. 6 illustrates a schematic diagram of a circuit (600) that is substantially similar to circuit 500, albeit different in some ways. In this embodiment, the keeper circuit 102 is implemented by transistor M9, and the other keeper circuit is implemented by transistor M17. In this example, transistors M3, M5, M9, and M17 are n-type transistors. Transistor M9 is configured to ensure that signal lr is actively driven. Transistor M17 is configured to ensure that signal lrb is actively driven.

Figure 7:
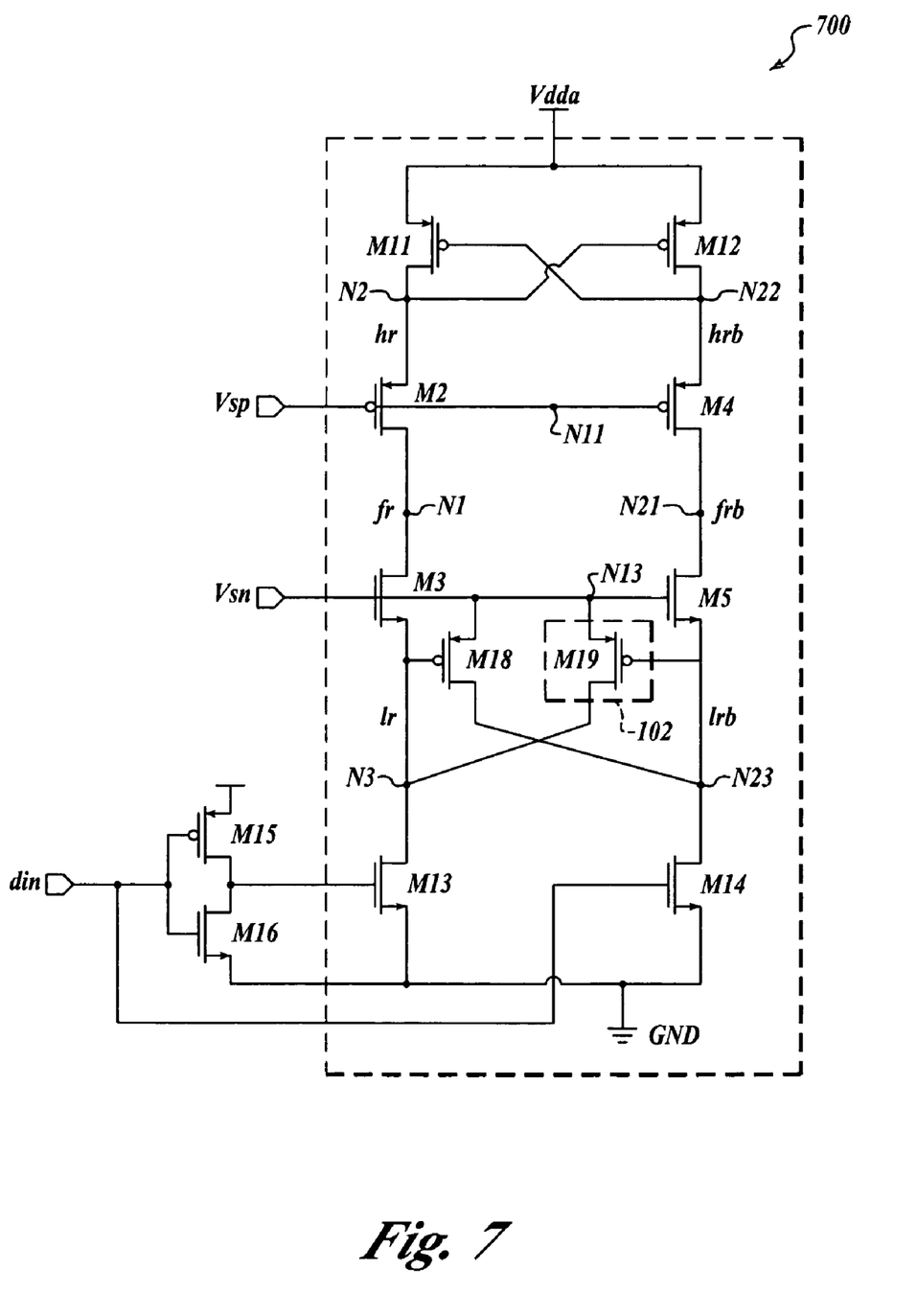
FIG. 7 illustrates a schematic diagram of another exemplary embodiment of a level translator circuit with a keeper switch, arranged in accordance with aspects of the present invention.

FIG. 7 illustrates a schematic diagram of a circuit (700) that is substantially similar to circuit 600, albeit different in some ways. In this embodiment, keeper circuit 102 is implemented by transistor M19, and the other keeper circuit is implemented by transistor M18. Keeper switch circuit 102 and the other keeper switch circuit are each coupled respectively to nodes N3, N13, and M23. Transistor M19 has a gate that is coupled to node N23, a source that is coupled to node N13, and a drain that is coupled to node N3. Transistor M18 has a gate that is coupled to node N3, a source that is coupled to node N13, and a drain that is coupled to node N23.

In this example, keeper switch circuit 102 is configured to influence a resistance between nodes N3 and M13. Keeper switch circuit 102 is configured to receive a control signal (e.g. signal lrb at node N23). Also, the keeper switch circuit 102 is further configured to couple node N3 to node N13 if the control signal corresponds to a first logic level (e.g. low). Additionally, keeper switch circuit 102 is further configured to isolate node N3 from node N13 if the control signal corresponds to a second logic level (e.g. high). In this example, transistors M3 and M5 are n-type transistors, and transistor M18 and M19 are p-type transistors.

The above specification, examples and data provide a description of the manufacture and use of the composition of the invention. Since many embodiments of the invention can be made without departing from the spirit and scope of the invention, the invention also resides in the claims hereinafter appended.

What is claimed is:
1. A logic circuit comprising:
  a first transistor;
  a second transistor that is arranged to operate as a cascode transistor in cooperation with the first transistor, wherein the second transistor includes:
    a gate that is coupled to a bias node,
    a drain that is coupled to a first output node, and
    a source that is coupled to a second output node;
  a third transistor;
  a fourth transistor that is arranged to operate as a cascode transistor in cooperation with the third transistor, wherein the fourth transistor includes:
    a gate that is coupled to the bias node,
    a drain that is coupled to a first complement output node, and
    a source that is coupled to a second complement output node,
  a first keeper switch circuit that is coupled to the bias node, the second complement output node, and the second output node, and
  a second keeper switch circuit that is coupled to the bias node, second output node, and the second complement output node.

2. The logic circuit of claim 1, wherein
the second transistor is configured to receive a first cascode bias voltage at the bias node, wherein
the first cascode bias voltage is suitable for biasing a cascode transistor.

3. The logic circuit of claim 1, wherein
the first keeper switch circuit is configured to influence a resistance between the second output node and the bias node in response to a control signal.

4. The logic circuit of claim 1, wherein
the first keeper switch circuit is configured to:
  receive a control signal at the second complement output node;
  couple the second output node to the bias node if the control signal corresponds to a first logic level; and
  isolate the second output node from the bias node if the control signal corresponds to a second logic level.

5. The logic circuit of claim 1, wherein
the logic circuit is arranged to operate as a level shifter circuit.

6. The logic circuit of claim 1, wherein
the first keeper switch circuit comprises a keeper transistor including:
  a gate that is coupled to the second complement output node,
  a source that is coupled to one of a group consisting of the second output node and the bias node, and
  a drain that is coupled to the other of the group consisting of the second output node and the bias node.

7. The logic circuit of claim 6, wherein
the second transistor is one of a group consisting of an n-type transistor and a p-type transistor, and the keeper transistor is the other of the group consisting of the n-type transistor and the p-type transistor.

8. The logic circuit of claim 1, wherein
the second keeper switch circuit comprises a fifth transistor including:
  a gate that is coupled to the second output node,
  a source that is coupled to one of a group consisting of the second complement output node and the bias node, and
  a drain that is coupled to the other of the group consisting of the second complement output node and the bias node.

9. The logic circuit as in claim 8, wherein
the first keeper switch circuit comprises a keeper transistor, and
wherein the second transistor is one of a group consisting of an n-type transistor and a p-type transistor, the keeper transistor is the other of the group consisting of the n-type transistor and the p-type transistor, and the fifth transistor is the other of the n-type transistor and the p-type transistor.

* * * * *

UNITED STATES PATENT AND TRADEMARK OFFICE
CERTIFICATE OF CORRECTION

| | | |
|---|---|---|
| PATENT NO. | : 7,053,658 B2 | Page 1 of 1 |
| APPLICATION NO. | : 10/724028 | |
| DATED | : May 30, 2006 | |
| INVENTOR(S) | : Timothy Lance Blankenship et al. | |

It is certified that error appears in the above-identified patent and that said Letters Patent is hereby corrected as shown below:

In the Specification:

Column 3, Line 66, Delete "MIO" and insert -- M10 --.

Column 4, Line 2, Delete "MIO" and insert -- M10 --.

Signed and Sealed this

Twenty-sixth Day of December, 2006

JON W. DUDAS
*Director of the United States Patent and Trademark Office*